United States Patent [19]
Abe et al.

[11] Patent Number: 5,185,625
[45] Date of Patent: Feb. 9, 1993

[54] EXPOSURE APPARATUS FOR FORMING PATTERN ON PRINTED-WIRING BOARD

[75] Inventors: Chiaki Abe; Minoru Watanuki, both of Tokyo, Japan

[73] Assignee: ORC Manufacturing Co., Ltd., Chofu, Japan

[21] Appl. No.: 836,655

[22] Filed: Feb. 18, 1992

[30] Foreign Application Priority Data

May 13, 1991 [JP] Japan .................... 3-107430

[51] Int. Cl.⁵ .................... G03B 27/32; G03B 27/52
[52] U.S. Cl. .................................... 355/26; 355/53
[58] Field of Search ................ 355/26, 70, 53, 89

[56] References Cited

U.S. PATENT DOCUMENTS

| | | | |
|---|---|---|---|
| 4,109,158 | 8/1978 | Blitchington | 250/548 |
| 4,389,115 | 6/1983 | Richter | 355/26 |
| 4,565,443 | 1/1986 | Yazaki | 355/26 X |
| 4,721,980 | 1/1988 | Yazaki | 355/26 |
| 4,883,571 | 11/1989 | Kondo et al. | 204/180.6 |
| 5,037,722 | 8/1991 | Watanuki | 430/319 |
| 5,119,127 | 6/1992 | Wantanuki | 355/53 |

FOREIGN PATENT DOCUMENTS 0363590 4/1990 European Pat. Off.
3340653 5/1985 Fed. Rep. of Germany.

Primary Examiner—Richard A. Wintercorn
Attorney, Agent, or Firm—Longacre & White

[57] ABSTRACT

An exposure apparatus having upper and lower ultraviolet rays irradiating devices which are vertically symmetrically disposed above and below a pattern-forming board having through holes therein, and upper and lower light-transmissible plates which are disposed spacedly from each other in a light path of the ultraviolet rays irradiated to the board so as to be vertically symmetrically disposed with respect to the board and horizontally movable, each of the ultraviolet rays irradiating devices having an electric discharge lamp and a reflection mirror and each of the light-transmissible plates having an uneven surface of a sawtooth section. With this arrangement, a proper photochemical reaction can be induced to the photoresist on the surface of the board and the inner wall surfaces of the through holes to thereby improve a working efficiency of a pattern forming process.

1 Claim, 12 Drawing Sheets

EXPOSURE APPARATUS FOR FORMING PATTERN ON PRINTED-WIRING BOARD

BACKGROUND OF THE INVENTION

1. Field of the Invention

The present invention relates to a photoresist exposure apparatus for forming a pattern on the surface of a printed-wiring board having through holes using a photolithographic technology, and more particularly to a photoresist exposure apparatus for inducing a proper photochemical reaction in a photosensitive resin (electrodeposited photoresist) which is electrically deposited on the surface of the board and on the inner wall surfaces of the through-holes to thereby improve a working efficiency for an exposure process.

2. Description of the Related Art

In a conventional pattern-forming process in which using the photolithographic technology, patterns are formed on both sides of a printed-wiring board having through-holes therein and then electrically connected through a copper-plated layer which is coated on the inner wall surface of each of the through-holes, the following treatments have been made in order to prevent the copper-plated layer from being damaged due to an etching treatment: (1) the surface of the board is covered with a dry film, and the opening of each through-hole is closed with a thin resist film 1 which has been hardened by irradiation of light (tenting method) as shown in FIG. 15, or (2) after exposure and development processes, solder 4 is plated over the exposed surface of the copper-plated layer (solder/through-hole method). Therefore, the pretreatment for an etching process is very complicate. In FIGS. 15 and 16, reference numerals 5, 6 and 7 denote a board (copper-clad laminate), an insulating substrate and a copper foil, respectively, and a reference numeral 9 (a part sectioned by dotted lines) denotes parts to be removed in the etching process.

In order to overcome the disadvantage as described above, the same applicant as the present application has proposed an exposure apparatus in which an electrodeposition-type photoresist 10 (a photosensitive resin having electrodepositing capability) is coated on the surface of the board and on the inner wall surfaces of the through-holes as shown in FIG. 17, and ultraviolet rays used in a pattern forming process are irradiated to the through-holes 2 to harden the photoresist 10, thereby protecting the copper-plated layer 3 (as disclosed in Japanese Laid-Open (Unexamined Published) Patent Application No. HEI-2-254455).

The exposure apparatus includes a light source 14 having plural ultraviolet lamps 13 and foldable plane reflection mirrors 15, the light source 14 and the reflection mirrors 15 being disposed so as to be freely rotatably in both clockwise and counterclockwise directions arouund axes 16 and 17 in parallel to the board 5, respectively, as shown in FIG. 18. In the exposure apparatus thus constructed, the light source 14 is horizontally disposed adjacently to the board 5 so as to sandwich the board 5 as indicated by a solid line, and in this state the ultraviolet rays are irradiated to the board 5 to photocure the photoresist on the inner walls of the throughholes. Thereafter, the light source 14 is vertically disposed to the board 5 as indicated by an imaginary line (two-dotted line), and in this state the board 5 is irradiated with the ultraviolet rays through plane reflection mirrors 15 which are slantly disposed to the board 5 as indicated by an imaginary line (two-dotted line) of FIG. 18 to photocure the photoresist on the surface of the board.

As described above, this apparatus performs the protection of the copper-plated layer in the through holes with the photocured photoresist, so that the copper-plated layer coated on the inner wall surface of the through-holes can be prevented from being damaged without onerous pretreatments as described above. In addition, the light source 14 is used to satisfy two requirements, that is, serves not only to form a pattern on the board 5, but also to protect the through-holes, so that the exposure process can be carried out with only one exposure apparatus.

However, there are still some improvements as described below which should be made to the aforementioned exposure apparatus.

When the exposure treatment is conducted on the inside of the through-holes, the ultraviolet rays 18 are irradiated into the through-holes at an inclination angle which is vertical or nearly vertical to the board 5, the intensity of the exposure light (ultraviolet rays) for the inside of the through-holes is more extremely great than that of the exposure light for the surface of the board 5. This reason will be described later.

Accordingly, when an exposure process is carried out for the inside of the through-holes, the photoresist 10 coated on the surface of the board must be covered by a mask (not shown). On the other hand, when another exposure is carred out for the surface of the board, the mask must be first removed, and then the exposure process is conducted through a pattern-forming film. Therefore, the exposure process can not be smoothly carried out.

The relationship between an incident angle of the ultraviolet rays and the intensity of the ultraviolet rays to photocure the photoresist will be hereunder described.

As shown in FIG. 17, when the ultraviolet rays are irradiated at an inclination angle $\alpha$ to the board 5 which is coated with the photoresist 10 and has a thickness of d, an exposure amount of the ultraviolet rays required for photocuring the photoresist 10 having a thicknessof d1 which is determined by the equation (1), and another exposure amount of the ultraviolet rays required for photocuring the photoresist 10 having a thickness of d2 which is provided by the equation (2) are required for the exposure of the inside of the through holes and the surface of the board, respectively. Therefore, the ratio of both exposure amounts (d1/d2) is equal to tan$\alpha$.

$$d1 = d/\cos \alpha \tag{1}$$

$$d2 = d/\sin \alpha \tag{2}$$

The ratio of the exposure amounts of the ultraviolet rays, tan$\alpha$, for example, d1/d2 is approximately equal to 11 for $\alpha = 85$ degrees, and thus a stronger ultraviolet light is needed for the exposure of the photoresist on the inner wall surfaces of the through-holes. On the other hand, the ration d1/d2 is approximately equal to 2.74 for $\alpha = 70$. From these data, it is clearly understood that the difference in inclination angle causes the remarkably variation in the alue of d1/d2.

In addition, the exposure apparatus shown in FIG. 18 needs plural ultraviolet lamps to irradiate the ultraviolet rays to the through-holes at an edge portion of the board, so that a demanded power for the light source is increased.

In order to solve the aforementioned problems, an exposure apparatus in which the ultraviolet rays are irradiated to the overall board 5 to simultaneously photocure the electrodeposited photoresists coated on the inner wall surfaces of the through-holes and on the surface of the board has been intensively researched. This apparatus includes a single electric discharge lamp 13, a reflection mirror 20 which constitute upper and lower ultraviolet rays irradiating sources, and light-transmittable members 22 such as a ground glass which are vertically symmetrically disposed at middle portions between the ultraviolet rays irradiating sources and the board 5. The ultraviolet rays emitted from the ultraviolet rays irradiating sources are passed through the light-transmittable members 22 to be scattered, so that the substantially homogeneous lights 23 having no directivity can be irradiated onto the overall surface of the board 5.

Nevertheless, this kind of apparatus had to be given up according to a lot of research results for the reasons below:

(1) The light transmitted through the light-transmittable members 22 is weaker in intensity than an expected value, and thus it takes a long time to photocure the resist on the inner walls of the through-holes, so that the photoresist may be peeled off due to a thermal action of infrared ray contained in the irradiated light or may be lost in a developing process due to incomplete photocuring of the photoresist.

(2) When in order to perform the proper exposure for the photoresist inside the through-holes, an output of the electric discharging lamp 13 is increased, the photoresist on the surface of the board is excessively photocured and it is difficult to remove the resist in the developing process and after the etching process.

SUMMARY OF THE INVENTION

In view of the above described disadvantages of the prior art, it is an object of the present invention to provide an exposure apparatus for pattern formation in which a proper photochemical reaction takes place on the electrodeposited photoresist coated on the surface of the board and on the inner wall surfaces of the through-holes formed in the board to prevent deterioration of workpiece quality due to excessive and deficient exposure, and additionally, the exposure process can be smoothly conducted to improve the working efficiency of the pattern forming process.

In order to attain the above object, the present invention provides an exposure apparatus for pattern formation in which ultraviolet rays are irradiated to a board through a pattern forming film to induce a photochemical reaction to an electrodeposited photoresist coated on the surface of the board and the inner wall surfaces of the through-holes formed in the board to thereby form a pattern on the surface of the board, being characterized by including upper and lower ultraviolet-rays irradiating sources each having an electric discharging lamp and a reflection mirror, which are vertically symmetrically disposed above and below the board, and upper and lower flat light-transmissible plates each having a sawtooth section which are disposed spacedly from each other above and below the board 5 in a light path of the ultraviolet rays irradiated to the board so as to be vertically symmetrical with respect to the board and horizontally movable.

According to the pattern forming exposure apparatus of the present invention, the following effects are obtained.

(1) Since the upper and lower light-transmissible plates having a sawtooth section are disposed spacedly from each other vertically symmetrically in the light path of the ultraviolet rays irradiated to the board, it is possible to simultaneously irradiate the inclined ultraviolet rays into the through-holes from front-and-rear and left-and-right sides, whereby the electrodeposited photoresist inside of the through-holes can be uniformly photocured.

(2) Since the ultraviolet rays can be irradiated into the through-holes at a predetermined inclination angle or an inclination angle near to the predetermined one, a proper photochemical reaction can be induced to the electrodeposited photoresists coated on the surface of the board and inside the through-holes.

(3) Since the light-transmittable plates are horizontally movable, so that the proper photochemical reaction can be induced to the overall photoresist inside of the through holes which are dispersively provided on the board.

(4) As a result of the above effects (1), (2) and (3), the exposure for the electrodeposited photoresists on the surface of the board and inside the through holes (on the inner wall surfaces of the through-holes) can be successively carried out. In addition, the conventional pretreatment for the etching process and the installing and removing operation of the mask are not required, so that the improvement of the working efficiency of the exposure process can be expected.

BRIEF DESCRIPTION OF THE DRAWINGS

The above and other objects, features and advantages of the present invention will become more apparent from the following description of the preferred embodiment thereof taken in conjunction with the accompanying drawings, in which like reference numerals denote like members and of which.

DETAILED DESCRIPTION OF THE PREFERRED EMBODIMENTS

Preferred embodiment of the present invention will be described below with reference to the accompanying drawings.

FIGS. 1 to 12 show a first embodiment according to the present invention. A main part of this embodiment comprises short-arc type electric discharge lamps 32 which are vertically symmetrically disposed spacedly from each other above and below a board 31, upper and lower reflection mirrors 33 each of which has a rectangular section in a horizontal direction and a fanwisely-broadened section in a vertical direction, and upper and lower light-transmissible plates 34 which are vertically symmetrically disposed at middle positions between the discharge lamps 32 and the board 31. The light-transmissible plates 34 are forwardly and rearwardly (in a direction of an arrow a in FIG. 1), upwardly and downwardly (in a direction of an arrow b in FIG. 2) and leftwardly and rightwardly (in a direction of an arrow c in FIG. 1) movable as described later.

Figure 1:
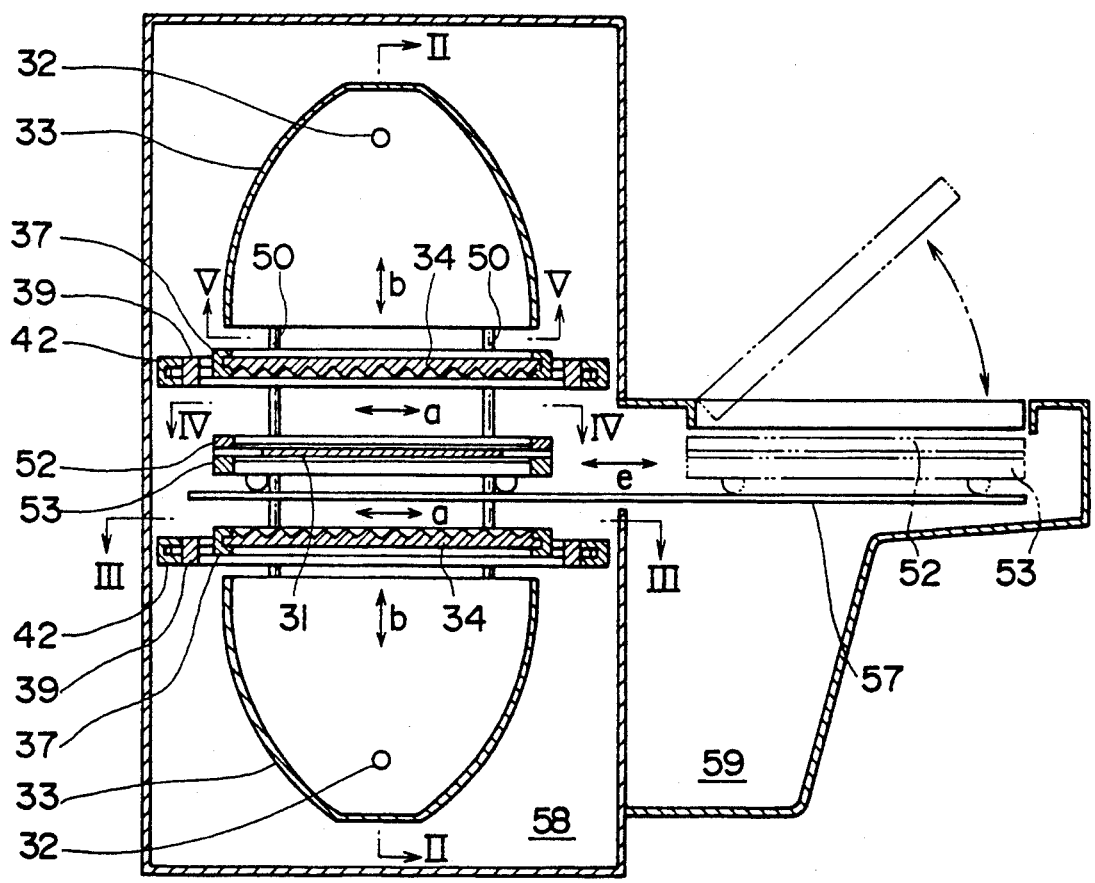
FIG. 1 is a cross-sectional side view of an exposure apparatus, which is employed to explain one embodiment of the exposure apparatus according to the present invention.
Figure 3:
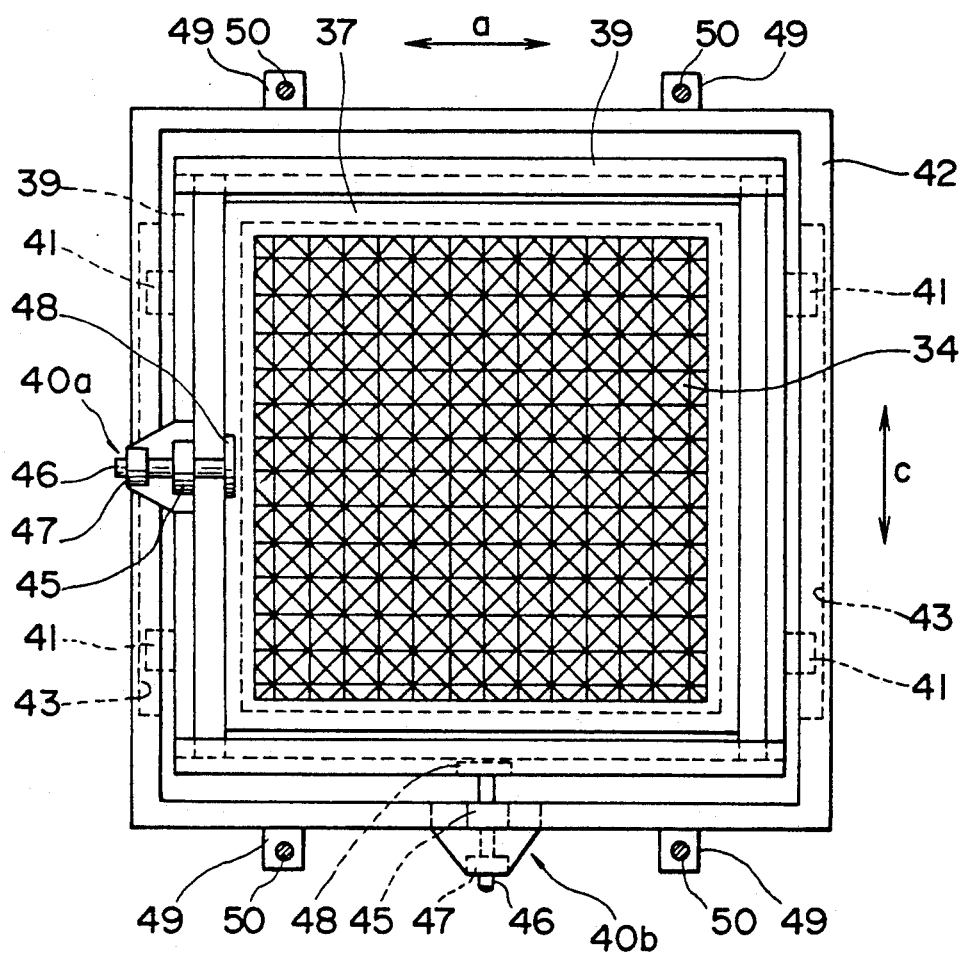
FIG. 3 is an enlarged cross-sectional view of the exposure apparatus which is taken along an arrow III—III in FIG. 1.
Figure 6:
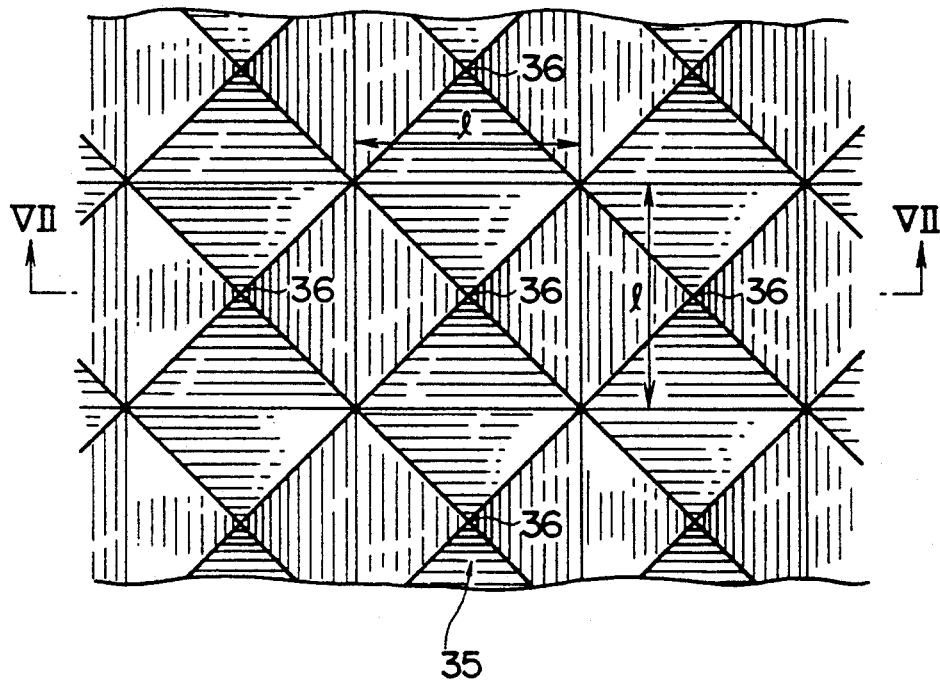
FIG. 6 is an enlarged view showing a light-transmissible plate shown in FIG. 3.
Figure 7:
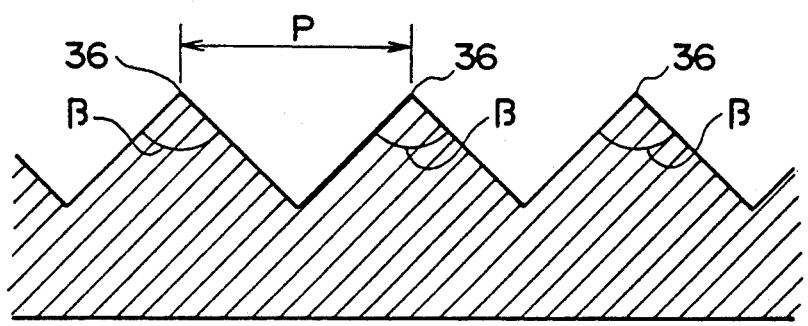
FIG. 7 is a cross-sectional view of the light-transmissible plate which is taken along an arrow VII—VII in FIG. 6.
Figure 8:
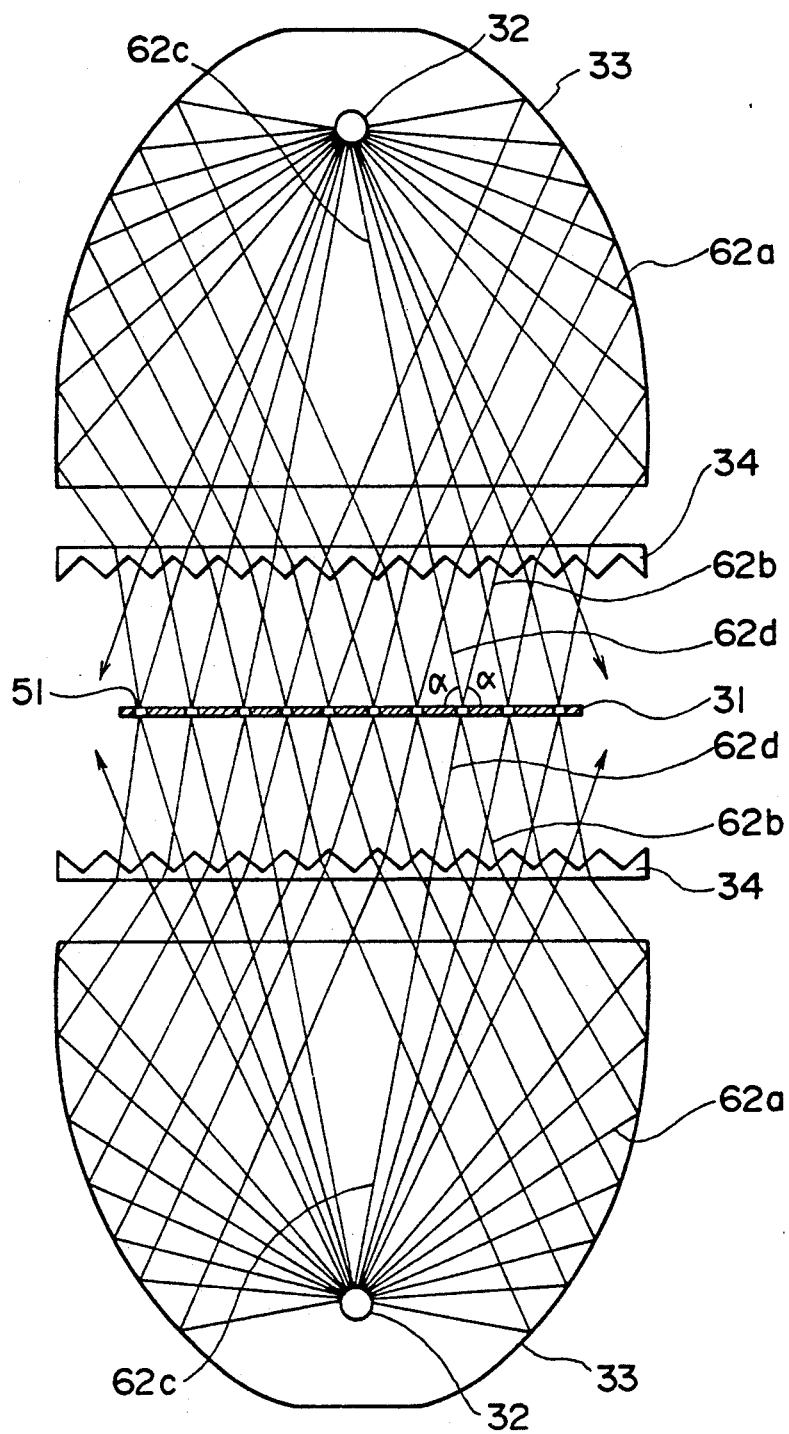
FIG. 8 is a cross-sectional front view showing an operation of the exposure apparatus as shown in FIG. 1.
Figure 9:
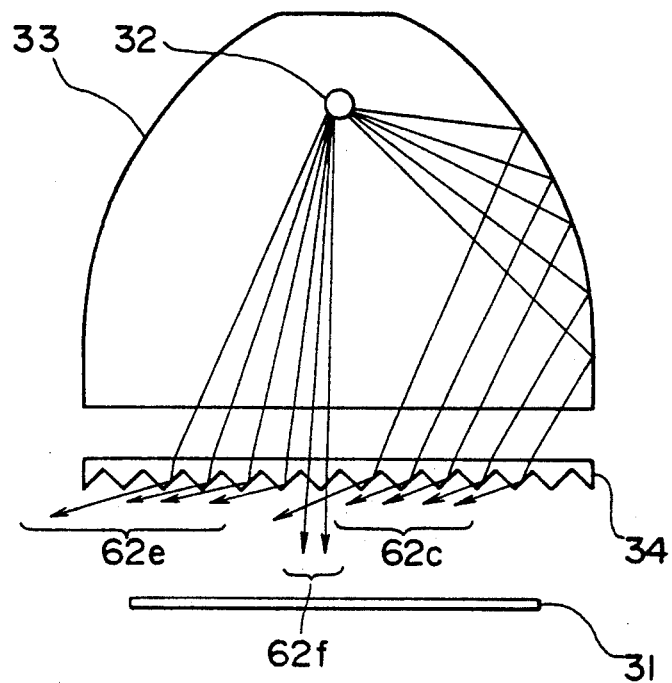
FIG. 9 is another cross-sectional front view showing the operation ι the exposure apparatus as shown in FIG. 1.

Each of the light-transmissible plates 34 has one surface which is flatly formed, and the other surface which is regularly unevenly formed in a sawtooth section. The uneven surface of the light-transmissible plate 34 may be formed by closely arranging a number of regular quartic cones (as shown in FIG. 6) with no gap therebetween in longitudinal and lateral directions of the plate 34. A numberal 36 denotes the top of each regular square pyramidal member, and the solid angle of the regular quartic cone is set to approximately 90 degrees while the length of its bottom side 1 is set to approximately 8 millimeters. In FIGS. 1, 3 and 8, the dimension of the sawtooth of the light-transmissible plate 34 is illustratively enlarged to make it understood easily.

The light-transmissible plate 34 is made of a transparent material such as acrylic resin which is easily shaped, however, the acrylic resin is liable to be deteriorated by ultraviolet rays having short wavelength (below approximately 300 nanometer). In order to overcome this disadvantage, a cylindrical optical filter made of Pyrex glass or the like (not shown) may be preferably provided around each of the discharge lamps 32, or a flat-plate type optical filter (not shown) may be preferably provided in a gap between the discharge lamps 32 and the light-transmissible plate 34. In this arrangement, not only the life-time of the light-tramsmissible plate 34, also the life-time of the pattern forming film and transparent plates 54 and 55 as described later which are also generally made of acrylic resin can be extended.

Figure 2:
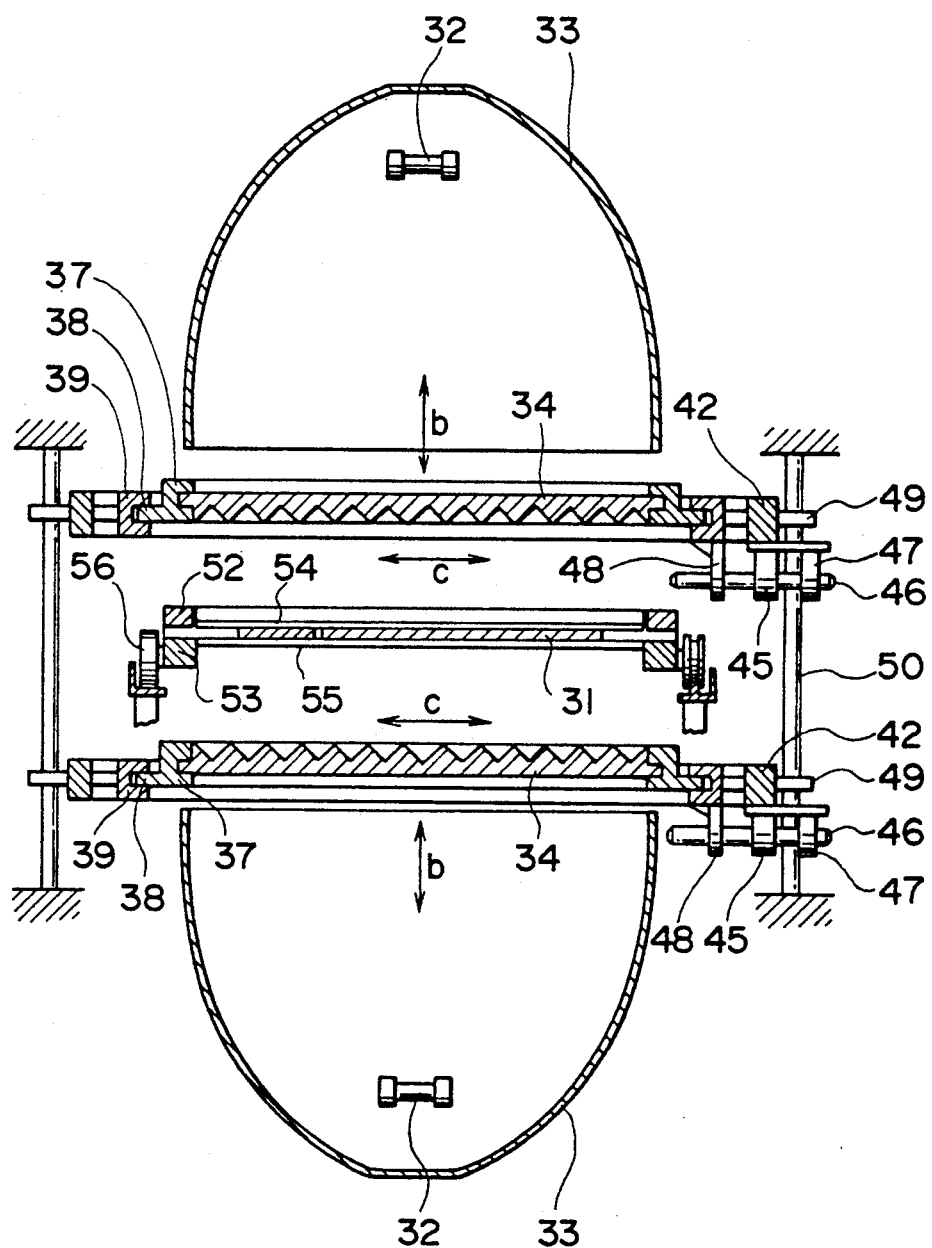
FIG. 2 is an enlarged cross-sectional view of the exposure apparatus which is taken along an arrow II—II in FIG. 1.

Rectangular edge frames 37 are used to support the light-transmissible plates 34 at the respective four sides thereof to reinforce the plates 34. Each of the edge frames 37 has guide members 38 projecting to the left and right sides as shown in FIG. 2, and is supported by an inside frame 39 so as to be slidable along guide grooves formed in the inner side of the inside frame 39. In addition, the edge frame 37 can be forwardly and rearwardly (in a direction of an arrow a) moved by a driving mechanism 40a which is bridged between the edge frame 37 and the inside frame 39 as shown in FIG. 3.

Further, as shown in FIGS. 1 and 3, the inside frame 39 has guide members 41 projecting to the front and rear sides thereof, and is supported by an outside frame 42 so as to be slidable through the guide members 41 along guide grooves 43 formed in the inner side of the outside frame 42. In addition, the inside frame 39 can be leftwardly and rightwardly (in a direction of an arrow c) moved by a driving mechanism 40b which is bridged between the inside frame 39 and the outside frame 42 as shown in FIG. 3.

Both of the driving mechanisms 40a and 40b are well-known almost the same type of screw driving mechanisms, and each of the driving mechanisms 40a and 40b comprises a screw bar 46 which is engaged with a holder 45 of a driving side so as to be freely rotatable, but unmovable forwardly and rearwardly as shown in FIG. 2, a motor 47 for driving the screw bar 46, and a screw member 48 which is fixedly secured to the driven side while engaged with the screw bar 46. When the screw bar 46 is rotatted, the screw block 48 is moved forwardly and backwardly along the screw bar 46, and the driven side is driven toward the screw bar 46 as shown in FIG. 2.

In addition, the outside frame 42 has four guide members 49 projected to the left and right sides thereof, and is supported by four guide poles so as to be upwardly and downwardly moved through the four guide members 49 along the four guide shafts 50 as shown in FIGS. 2 and 3. With a well-known screw driving mechanism (not shown), the outside frame 42 is upwardly and downwardly moved.

Figure 4:
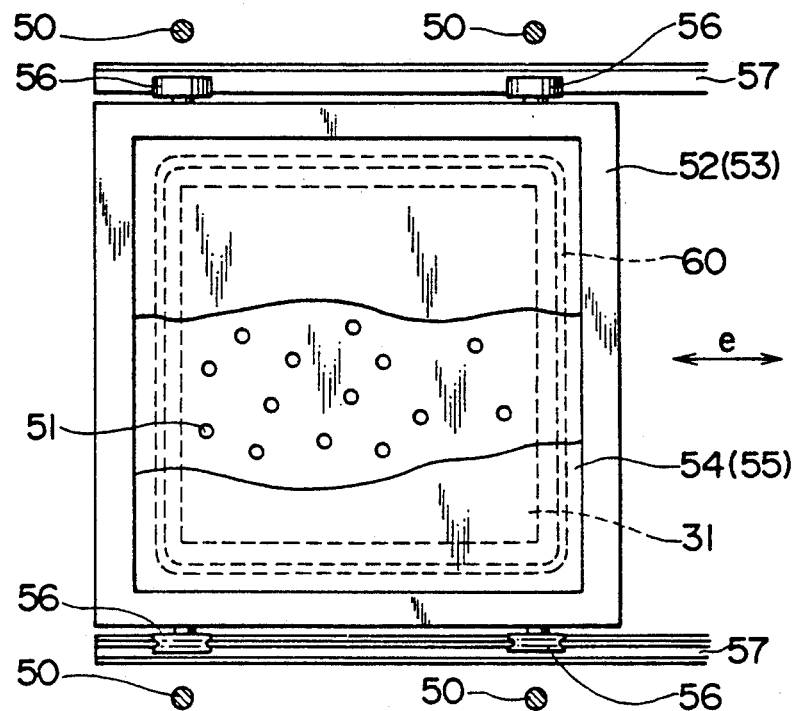
FIG. 4 is a partially enlarged cross-sectional view of the exposure apparatus which is taken along an arrow IV—IV in FIG. 1.
Figure 5:
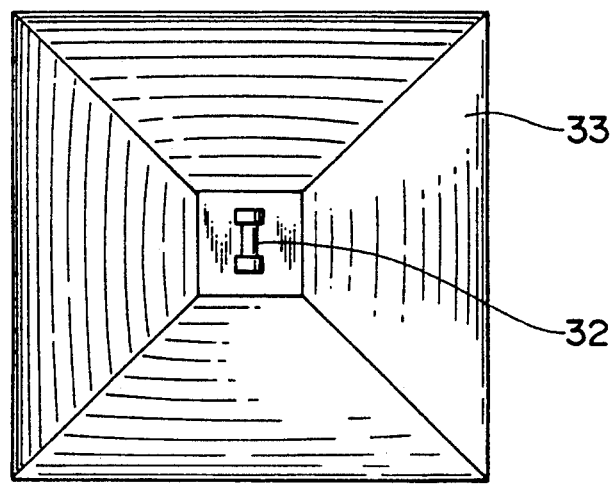
FIG. 5 is an enlarged cross-sectional view of the exposure apparatus which is taken along an arrow V—V in FIG. 1.

The board 31 is of a rectangular or square form and provided with many through-holes 51 (several thousands to ten thousands) over the surface thereof as shown in FIG. 4. The board 31 is sandwiched through a pattern forming film (not shown) between transparent plates 54 and 55 which are secured to upper and lower printing frames 52 and 53, and is reciprocatively moved through four wheels 56 secured to the lower printing frame 53 and two traveling rails 57 between an exposure section 58 and an operating section 59 (in a direction of an arrow e of FIG. 1).

A reference numberal 60 of FIG. 4 denotes A bank rubber ring which is adapted to seal the board 5 and disposed erectly from the lower transparent plate 55 so as to surround the board 31. In the exposure process, a flat space whic... is surrounded by the upper and lower transparent plates 54, 55 and the bank rubber ring 60 is decompressed to bring the pattern forming film (not shown) into close contact with the board 31.

A sectional shape or profile or each of the reflection mirrors 33 is so designed that the reflection mirrors have an intermediate reflection characteristic between reflection characteristics of an ellipsoidal section with which a reflected light focuses on one point, and a parabolic section with which the reflected light is collimated, that is, is so designed that the reflected lights are almost directed in parallel to one another toward to the inner side of the board 31 as shown in FIG. 8. In addition, the fanwisely broadening degree of the section of each reflection mirror (corresponding to the ellipticity of an ellipse) is set to such a value that the inclination angle of the reflected light 62b which is passed through the each light-transmissible plate 34 and incident onto the board 31 should be substantially equal to the minimum angle $\alpha_0$ with which the reflected light can be irradiated into the overall inner wall of the through-hole 51 whose height and inner diameter are presented by T and D, that is, should be substantially equal to arctan T/D (hereinafter referred to as "a predetermined inclination angle").

Next, Manipulation and operation of the apparatus as described above will be described below.

The board 31 is first placed in the operation section 59, and then a proper number of illumination photometers (not shown) are put at the exposure position so as to be upwardly and downwardly oriented and irradiated with the ultraviolet rays. The upper and lower light-transmissible plates 34 are upwardly and downwardly moved along the four guide poles 50 and located at optimum positions where indicated values of the illumination photometers for measuring the ultraviolet rays directed from the upper and lower sides are equal to each other, and correspond to the maximum values.

In this condition, the ultraviolet rays of the discharge lamps 32 are intersected with one another at the position of the board 31 or at a position adjacent thereto as shown in FIG. 8. After this pre-exposure operation, the exposure operation is started.

During the exposure process, a part of the ultraviolet rays 62a from each of the upper and lower discharge lamps 32 is reflected by each of the upper and lower reflection mirrors 33 to be irradiated to each of the upper and lower light-transmissible plates 34. The light 62b which is refracted within the light-transmissible plate 34 and thus whose inclination angle is increases is incident to the board 31 at a predetermined angle $\alpha_0$ or at an angle near to the predetermined angle, so that the surface of the board 31 and the inner wall surfaces of the through-holes 51 at the incident positions of the ultraviolet rays are irradiated with the ultraviolet rays to photocure irradiated parts of the electrodeposited photoresist.

In FIG. 8, all of the through-holes 51 are illustrated so as to be located at all of the incident position of the ultraviolet rays. Further, those rays which are reflected from the reflection mirrors 33 and then totally reflected through the light-transmissible plates 34 are not irradiated to the board 31 and thus deviated to a side, as shown by a right-handed side of FIG. 9.

Figure 12:
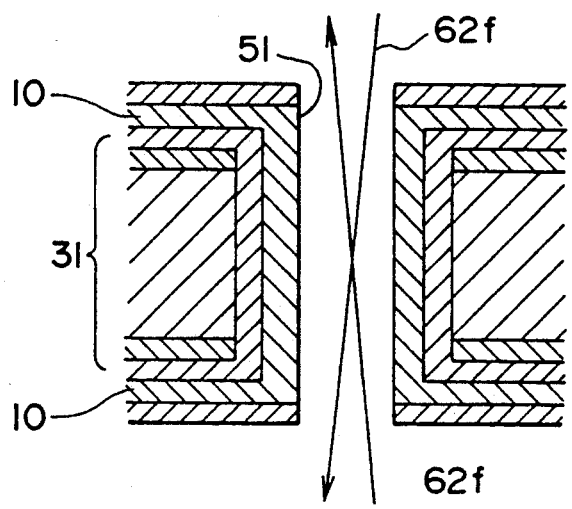
FIG. 12 is a cross-sectional front view showing the operation of the exposure apparatus as shown in FIG. 1.

In addition, parts 62c of the ultraviolet rays emitted from the upper and lower discharge lamps 32 are not reflected by the reflection mirrors and directly irradiated to the light-transmissible plates 34. The rays 62d which are refracted through the light-transmissible plates 34 with the inclination angle being increased are irradiated to the board 31 at the predetermined inclination angle $\alpha_0$ or at an angle near to the predetermined angle. The surface of the board 31 and the inner wall surfaces of the through-holes 51 at the incident positions of the ultraviolet rays 62d are irradiated with the rays 62d to photocure the irradiated parts of the electrodeposited photoresist. The rays 62e which are totally reflected through the light-transmissible plates 34 are not irradiated to the board 31 and deviated to a side as shown by a left side of FIG. 9. Further, the rays 62f which are vertically emitted from the center of each light-transmissible plate 34 are passed through the through-holes 51 as shown in FIG. 12.

Figure 11:
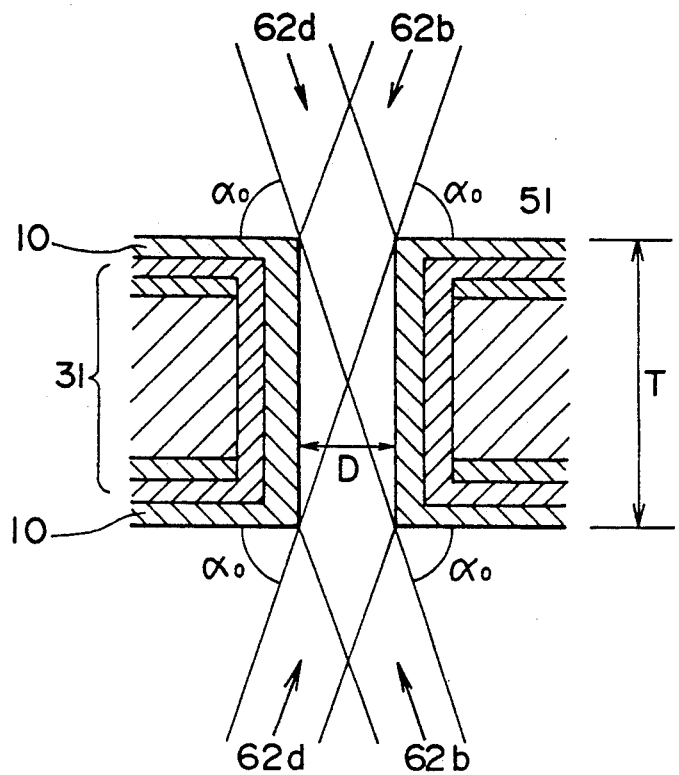
FIG. 11 is a cross-sectional front view showing the operation of the exposure apparatus as shown in FIG. 1.

FIG. 11 is an enlarged view showing a state that the ultraviolet rays are irradiated into the through-holes 51 at the predetermined inclination angle $\alpha_0$. In FIG. 11, the ultraviolet rays 62b and 62d which are illustrated by a single line in FIG. 8 are illustrated as a light flux having a thickness in FIG. 11 (the thickness originally corresponds to approximately a half of the sawtooth pitch p (see FIG. 7) and is still larger than the inner diameter D of the through-hole, but the thickness of the light flux is thinly illustrated to make the understanding easy). The rays 62b which are obliquely irradiated to the board 31 from the upper-right and lower-right directions are irradiated to the inner wall surface at the left side of each through hole, while the rays 62d which are obliquely irradiated to the board 31 from the upper-left and the lower-left directions are irradiated to the inner wall surface at the right side of each through-hold. In this way, the inner wall of the through-holes 51 is substantially uniformly and simultaneously exposed to the ultraviolet rays in cooperation with the ultraviolet rays directed from the four directions.

Figure 10:
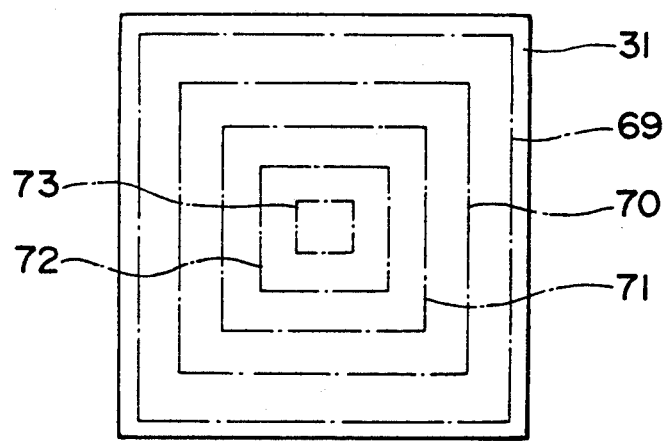
FIG. 10 is a plan view showing the operation of the exposure apparatus as shown in FIG. 1.

In this case, the aforementioned cooperating action of the four ultraviolet lights from four directions, that is, the intersecting irradiation of the ultraviolet rays directed from the four directions to the through holes takes place at the places indicated by one-dotted lines 69, 70, 71, 72 and 73 which are illustrated on the board 31 of FIG. 10. The interval between neighboring one-dotted lines should be originally drawn as corresponding to the size of the sawtooth pitch p (about 8 millimeters), and thus a number of one-dotted lines could be drawn on the board 31 of FIG. 10. However, in FIG. 10, the one-dotted lines are drawn as corresponding to the size of the sawtooth of FIG. 8.

At this time, the driving mechanisms 40a and 40b are driven to move the upper and lower light-transmissible plates 34 forwardly and rearwardly (in the direction of the arrow a) and leftwardly and rightwardly (in the direction of the arrow c). In association with this movement of the light-transmissible plates 34, the intersecting positions of the ultraviolet rays as indicated by the one-dotted lines 69 and 73 are parallel moved on the board 31, so that those through-holes 51 which have not been yet exposed to the ultraviolet rays are irradiated with the ultraviolet rays. Accordingly, all of the through holes which are dispersed over the overall surface of the board 5 can be successively exposed to the ultraviolet rays.

Since the ultraviolet rays 62b, 62c directed from four directions are intersected at the locating position of the board 31 or at a position adjacent to the locating position, the photochemical reaction can be completed with only one exposure operation for the through-holes irradiated with the ltraviolet rays. Therefore, the working efficiency for the exposure process can be improved. In addition, during the exposure of the through-holes to the ultraviolet rays, the electrodeposited photoresist on the surface of the board is also irradiated and photocured with the ultraviolet rays having the same intensity and incident at the same inclination angle.

Figure 17:
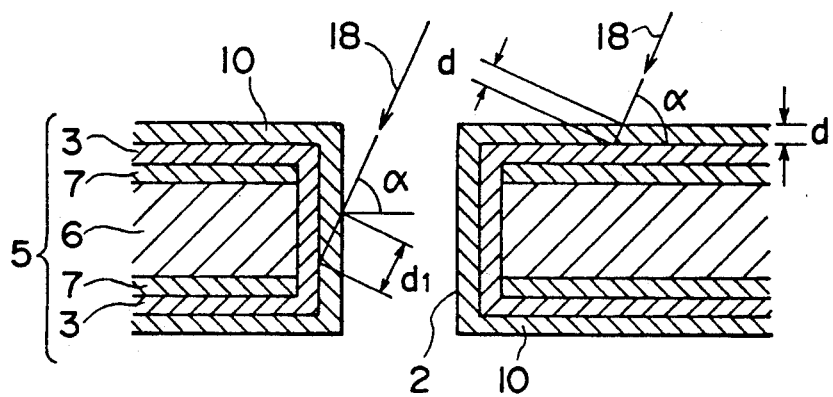
FIG. 17 is another sectional side view showing the conventional protection method for a copper-plated layer on the inner wall surface of a through-hole.
Figure 18:
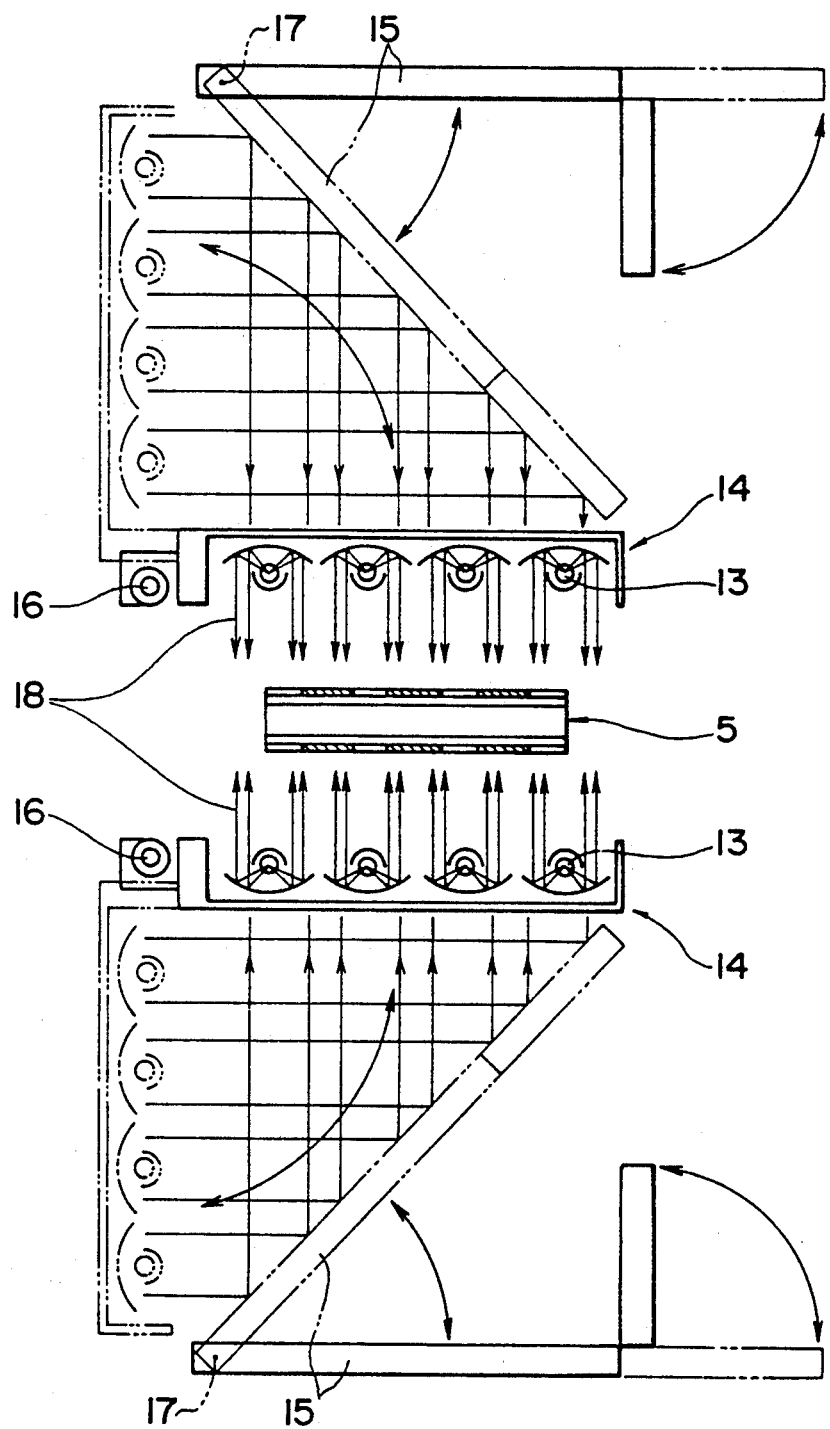
FIG. 18 is a cross-sectional side view showing the action of a conventional exposure apparatus.
Figure 19:
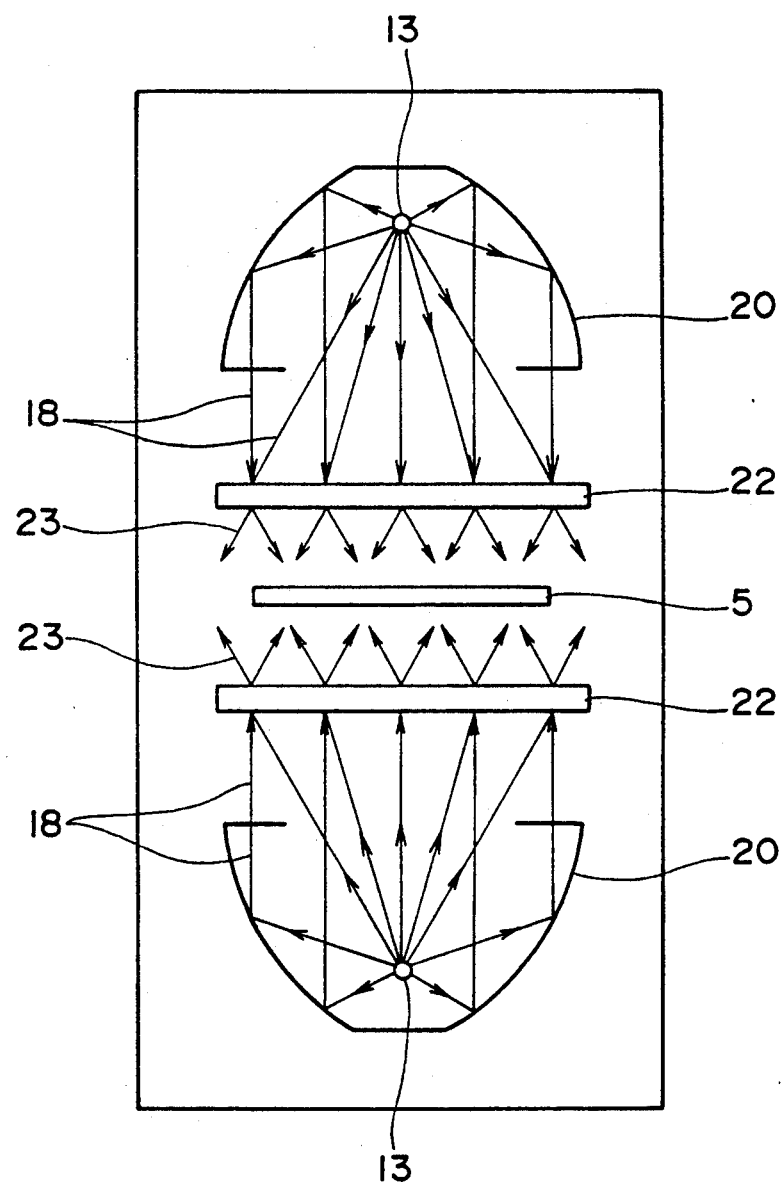
FIG. 19 is a cross-sectional side view showing the action of another conventional exposure apparatus.

As described above with reference to FIG. 17, the photoresist on the surface of the board is exposed to tan$\alpha$ times as much as the ultraviolet rays irradiated to the photoresist irradiated into the through-hold. The suitable exposure amount of the ultraviolet rays for an electrodeposited photoresist is in the range of 150 to 200 millijoules and the limit of the overexposure amount which does not affect a post-treatment such as a developing treatment is in the range of 600 to 700 millijoules. Therefore, in the apparatus of this embodiment a more effective result is obtained for a through hole having a inner diameter above 0.4 millimeter when the inclination angle $\alpha$ is set to approximately 74 degrees, that is, the thickness of the board is set to 1.6 millimeter.

Figure 13:
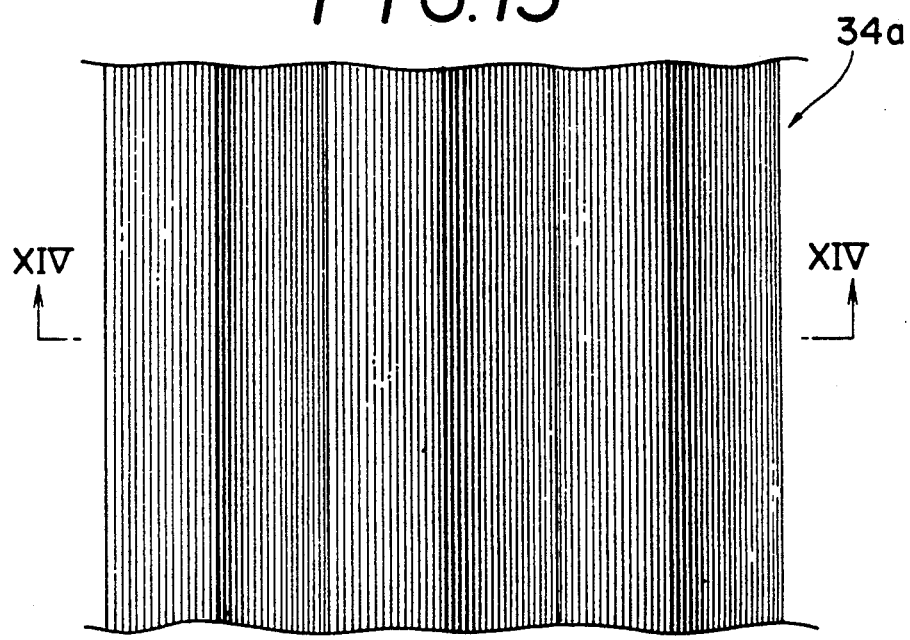
FIG. 13 is a plan view showing a light-transmissible plate utilized in another embodiment of the exposure apparatus according to the present invention, which corresponds to FIG. 6 of the first embodiment.
Figure 14:
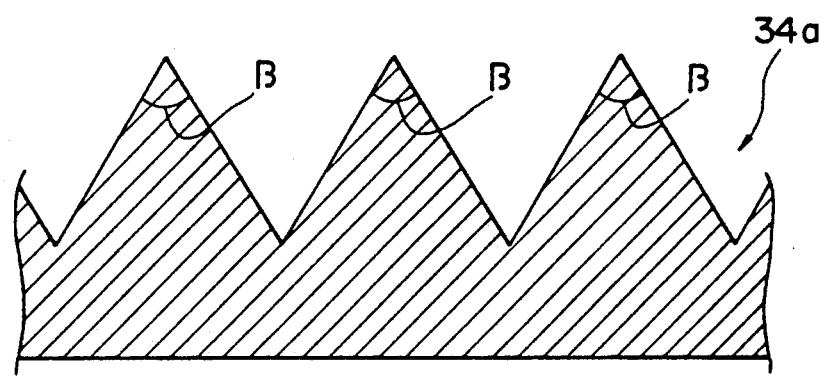
FIG. 14 is a cross-sectional view which is taken along an arrow XIV—XIV in FIG. 13.
Figure 15:
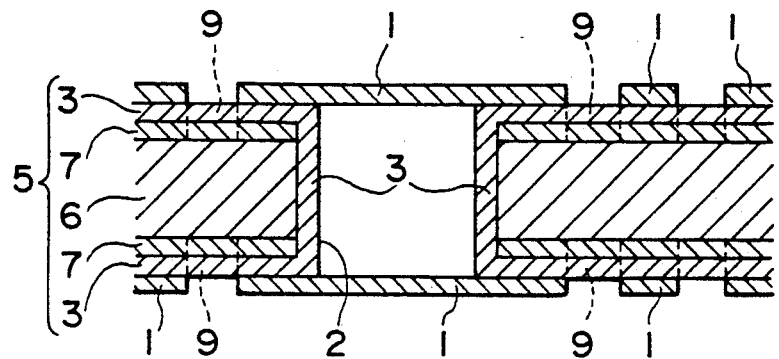
FIG. 15 is a cross-sectional side view showing a conventional protection method for a copper-plated layer on the inner wall surface of a through-hole.
Figure 16:
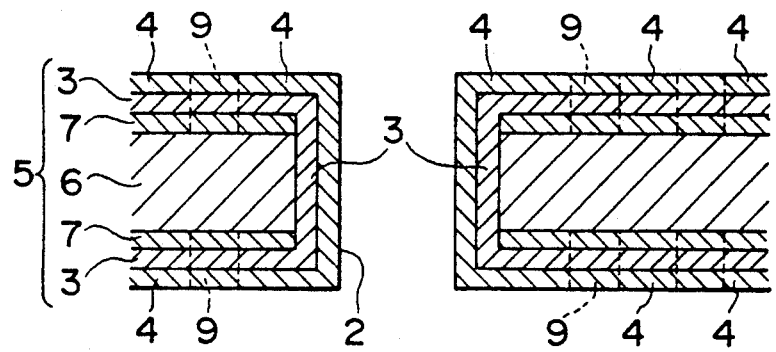
FIG. 16 is another cross-sectional side view showing the conventional protection method for a copper-plated layer on the inner wall surface of a through-hole.

FIGS. 13 and 14 show another embodiment according to the present invention. In this embodiment, a light-transmissible plate 34a has an uneven surface which is furrowly unevenly formed and has an uniform sawtooth section whose apex angle $\beta$ is 60 degrees, and a long-arc type mercury lamp is used as an electric discharging lamp. In addition, the reflection mirror is provided with vertical plane plates at both sides thereof. Except for these elements, other elements are identical to those of the first embodiment.

In the apparatus of this embodiment thus constructed, the inclination angle of the ultraviolet rays irradiated to the board 31 through the light-transmissible plate 34a can be set to a value larger than the inclination angle in the first embodiment, and thus the ultraviolet rays can be irradiated into a through hole having a smaller inner diameter.

The present invention is not limited to the above-described embodiments, and any modifications may be made to the above embodiments without departing from the subject matter of this invention. For example, the apex angle of the uneven surface may be set to any one of angles other than 60° and 90°. Further, the light-transmissible plate may be so disposed that the bottom side of each regular square pyramidal member may be slanted at 45° with respect to the forward-and-backward direction which is viewed in a direction of the plane, and the regular square pyramidalshape may be replaced by a regular triangular pyramidalshape for the surface shape of the light-transmissible plate.

As described above, the following excellent advantages are obtained in this invention.

(1) Since the upper and lower light-transmissible plates each having a sawtooth section are placed spacedly from each other in the light path of the ultraviolet rays irradiated to the board, the inclined ultraviolet rays can be simultaneously irradiated into the through-holes from the left-and-right direction and the forward-and-backward direction, so that the electrodeposited photoresist on the inner wall surfaces of the through-holes can be uniformly photocured.

(2) Since the ultraviolet rays can be irradiated into the through-holes at a predetermined inclination angle or an angle near to the predetermined angle, so that a proper photochemical reaction can be induced to the electrodeposited photoresist on the surface of the board and on the inner wall surfaces of the through-holes.

(3) Since the light-transmissible plates can be horizontally moved, the proper photochemical reaction can be induced to the photoresist of all the through-holes which are dispersed over the overall surface the board.

(4) As a result of the above effects (1), (2) and (3), the exposure process for the electrodeposited photoresist on the surface of the board and on the inner wall surfaces of the through-holes can be successively carried out. In addition, the pretreatment for the etching process and the installing and removing operation of the mask which are required for the conventional exposure apparatus are not required for this invention, so that the working efficiency for the exposure process can be improved.

(5) The applicant of the present invention keeps the patent right for many exposure apparatuses. Among them, the patent of U.S. Pat. No. 5,037,722 patented on Aug. 6, 1991 relates to a photoresist exposure method which includes two exposure steps: at the first step the photoresist coated on the inner wall surfaces of the through-holes is exposed through a mask film to ultraviolet rays from a light source positioned adjacently to the surface of a board while the light source is rotated along the surface of the workpiece, and at the second step the photoresist coated on the surface of the board is exposed through a pattern forming film for a precise circuit pattern to the ultraviolet rays from the light source which is located away from the board. However, in the exposure apparatus according to the present invention, the exposure can be easily performed using no mask film and at one step, so that the working efficiency can be greatly improved. Further, in another exposure method as disclosed in the Japanese Laid-Open Patent Application No. Hei-2-254455 which also includes two steps: at the first step the photoresist coated on the inner wall surfaces of the through-holes is exposed through a negative film to the ultraviolet rays; and at the second step the photoresist coated on the surface of the board is indirectly exposed through a pattern forming film for a precise circuit pattern to the ultraviolet rays supplied through a plane reflection mirror from a light source which is positioned away from a workpiece. However, in this invention the exposure for the photoresist coated on both of the surface of the board and the inner wall surfaces of the through-holes can be simultaneously completed at one step.

What is claimed is:

1. In an exposure apparatus in which ultraviolet rays are irradiated through a pattern forming film to a board to induce photochemical reaction to electrodeposited photoresists on the surface of the board and on the inner wall surfaces of through-holes formed in the board, thereby forming a pattern on the surface of the board, said exposure apparatus including:

upper and lower light sources each comprising an electric discharge lamp and a reflection mirror, which are disposed above and below the board so as to be vertically symmetrically disposed with respect to the board; and upper and lower flat light-transmissible plates each having a sawtooth section, which are disposed spacedly away from each other so as to be vertically symmetrically disposed with respect to the board in a light path of the ultraviolet rays irradiated to the board and horizontally movable.

* * * * *